US011802841B2

(12) United States Patent
Takagi et al.

(10) Patent No.: US 11,802,841 B2
(45) Date of Patent: Oct. 31, 2023

(54) DEFECT DETECTION DEVICE, DEFECT DETECTION METHOD, AND DEFECT OBSERVATION DEVICE

(71) Applicant: Hitachi High-Tech Corporation, Tokyo (JP)

(72) Inventors: Yuji Takagi, Tokyo (JP); Yuko Otani, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 695 days.

(21) Appl. No.: 16/970,451

(22) PCT Filed: Feb. 27, 2018

(86) PCT No.: PCT/JP2018/007297
§ 371 (c)(1),
(2) Date: Aug. 17, 2020

(87) PCT Pub. No.: WO2019/167129
PCT Pub. Date: Sep. 6, 2019

(65) Prior Publication Data
US 2021/0109035 A1 Apr. 15, 2021

(51) Int. Cl.
*G01N 21/95* (2006.01)
*G06T 7/70* (2017.01)
(Continued)

(52) U.S. Cl.
CPC ......... *G01N 21/9505* (2013.01); *G01N 21/47* (2013.01); *G01N 21/8851* (2013.01);
(Continued)

(58) Field of Classification Search
CPC .............. G01N 21/9505; G01N 21/47; G01N 21/8851; G01N 23/203; G01N 23/2251;
(Continued)

(56) References Cited

U.S. PATENT DOCUMENTS 7,936,392 B2  5/2011 Ng et al.
2003/0132405 A1  7/2003 Some
(Continued)

FOREIGN PATENT DOCUMENTS

JP   S57-80546 A   5/1982
JP   2005535869 A  11/2005
(Continued)

OTHER PUBLICATIONS

Office Action dated Apr. 21, 2021 in Korean Application No. 10-2020-7018676.
(Continued)

*Primary Examiner* — Nicole M Ippolito
*Assistant Examiner* — Hanway Chang
(74) *Attorney, Agent, or Firm* — MILES & STOCKBRIDGE, P.C.

(57) ABSTRACT

The invention is to provide a defect detection device capable of using a compact optical system to detect a plurality of types of defects with high sensitivity and high speed. The defect detection device includes an irradiation system that irradiates light onto an object to be inspected; an optical system that forms scattered light produced by a light irradiation into an image; a microlens array disposed at an image plane of the optical system; an imaging element that is disposed at a position offset from the imaging plane of the optical system and that images light that passes through the microlens array; a mask image storage unit that stores a plurality of mask images generated for each type of defect or each defect direction; and a calculation unit that carries out mask processing on an image obtained from the imaging element using the plurality of mask images and carries out defect detection processing.

13 Claims, 8 Drawing Sheets

(51) Int. Cl.
*G01N 21/47* (2006.01)
*G01N 21/88* (2006.01)
*G01N 23/203* (2006.01)
*G01N 23/2251* (2018.01)
*G06T 7/00* (2017.01)

(52) U.S. Cl.
CPC ....... *G01N 23/203* (2013.01); *G01N 23/2251* (2013.01); *G06T 7/001* (2013.01); *G06T 7/70* (2017.01); *G01N 2021/8854* (2013.01); *G01N 2021/8887* (2013.01); *G01N 2201/0633* (2013.01); *G01N 2223/045* (2013.01); *G01N 2223/053* (2013.01); *G01N 2223/07* (2013.01); *G01N 2223/418* (2013.01); *G01N 2223/507* (2013.01); *G01N 2223/6116* (2013.01); *G01N 2223/646* (2013.01); *G06T 2207/10061* (2013.01); *G06T 2207/30148* (2013.01)

(58) Field of Classification Search
CPC ... G01N 2021/8854; G01N 2021/8887; G01N 2201/0633; G01N 2223/045; G01N 2223/053; G01N 2223/07; G01N 2223/418; G01N 2223/507; G01N 2223/6116; G01N 2223/646; G06T 7/70; G06T 7/001; G06T 2207/10061; G06T 2207/30148

See application file for complete search history.

(56) References Cited

U.S. PATENT DOCUMENTS

| 2012/0212605 A1 | 8/2012 | Maruyama et al. |
| 2012/0274931 A1 | 11/2012 | Otani et al. |
| 2017/0219487 A1 | 8/2017 | Hill |

FOREIGN PATENT DOCUMENTS

| JP | 2011106974 A | 6/2011 |
| JP | 2011226989 A | 11/2011 |
| JP | 2012185149 A | 9/2012 |
| JP | 201559776 A | 3/2015 |
| JP | 2016191589 A | 11/2016 |

OTHER PUBLICATIONS

Search Report dated May 29, 2018 in International Application No. PCT/JP2018/007297.
Written Opinion dated May 29, 2018 in International Application No. PCT/JP2018/007297.
Ren Ng et al. "Light Field Photography with a Hand-held Plenoptic Camera" Stanford Tech Report, Apr. 2005, pp. 1-11.

[FIG. 1]
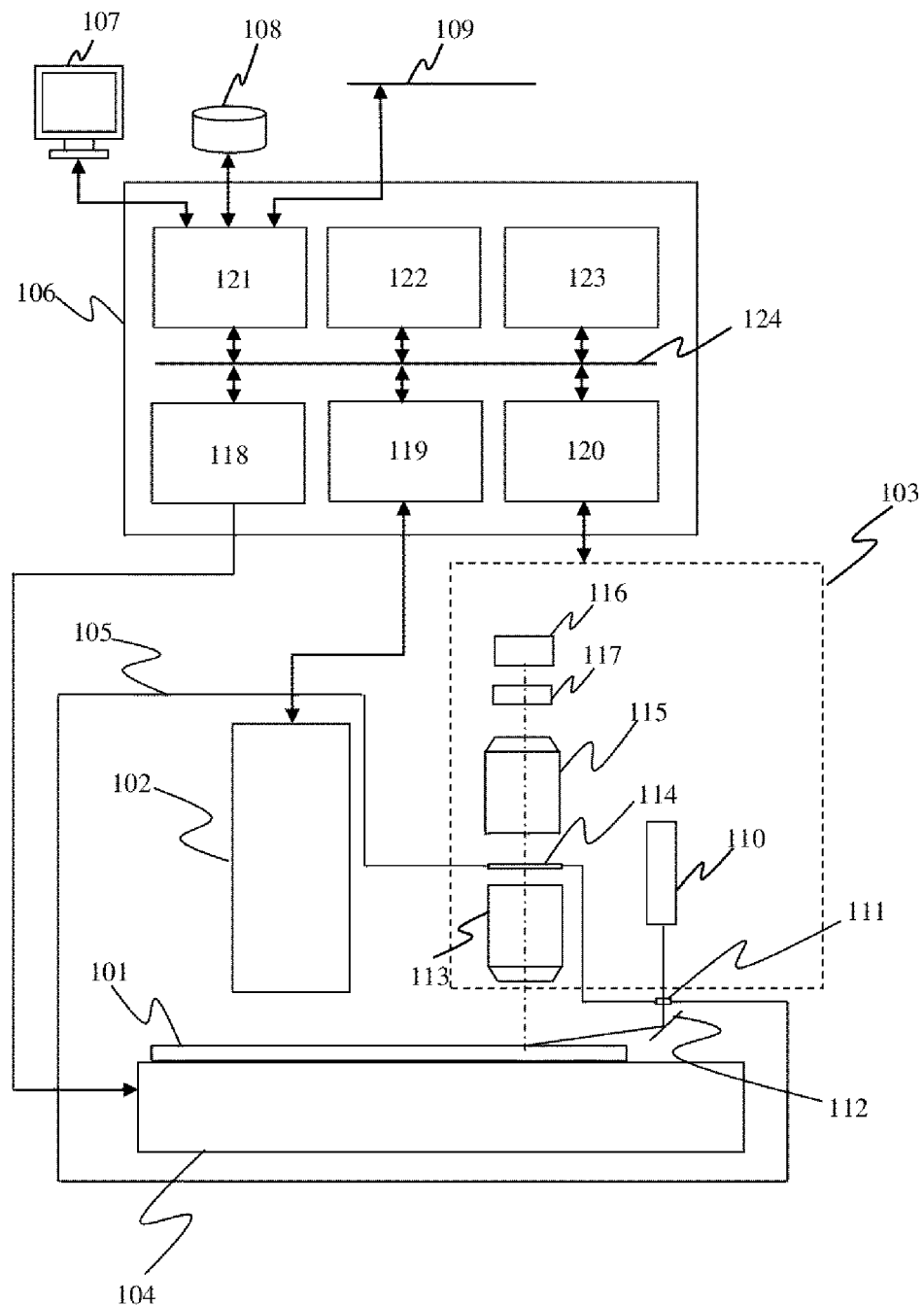

[FIG. 2]
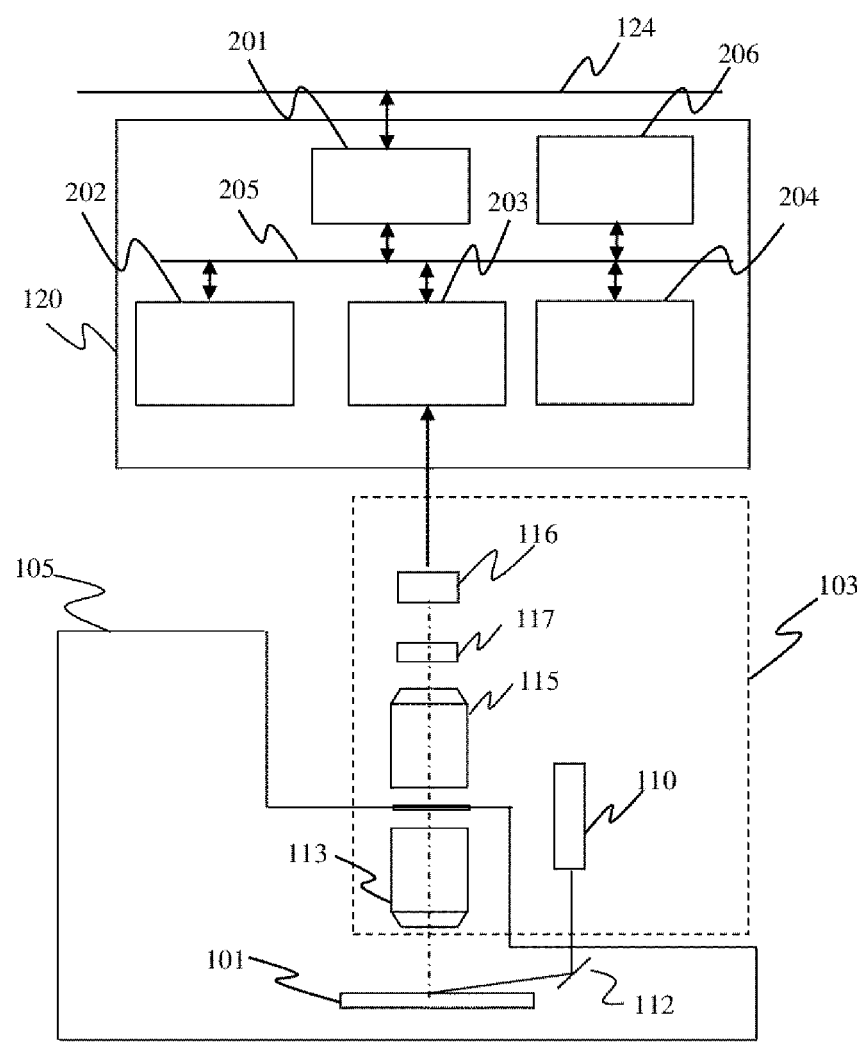

[FIG. 3]
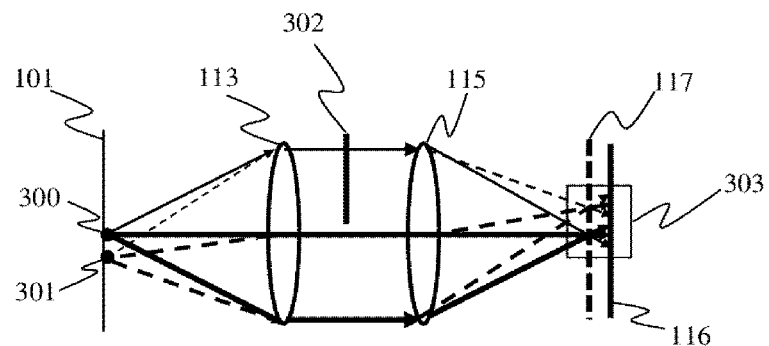
[FIG. 4]
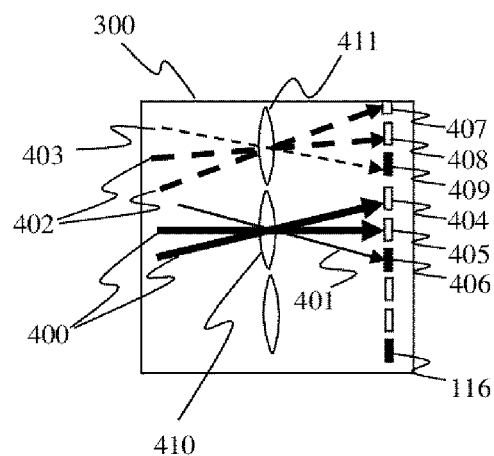
[FIG. 5]
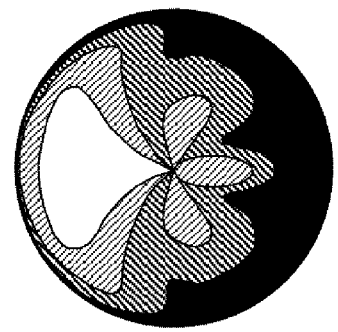

[FIG. 6]
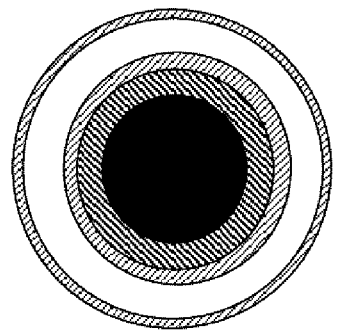
[FIG. 7]
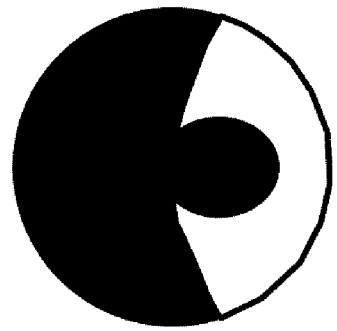
[FIG. 8]
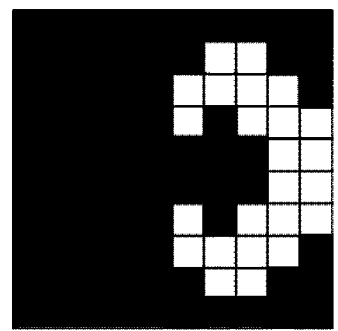

[FIG. 9]
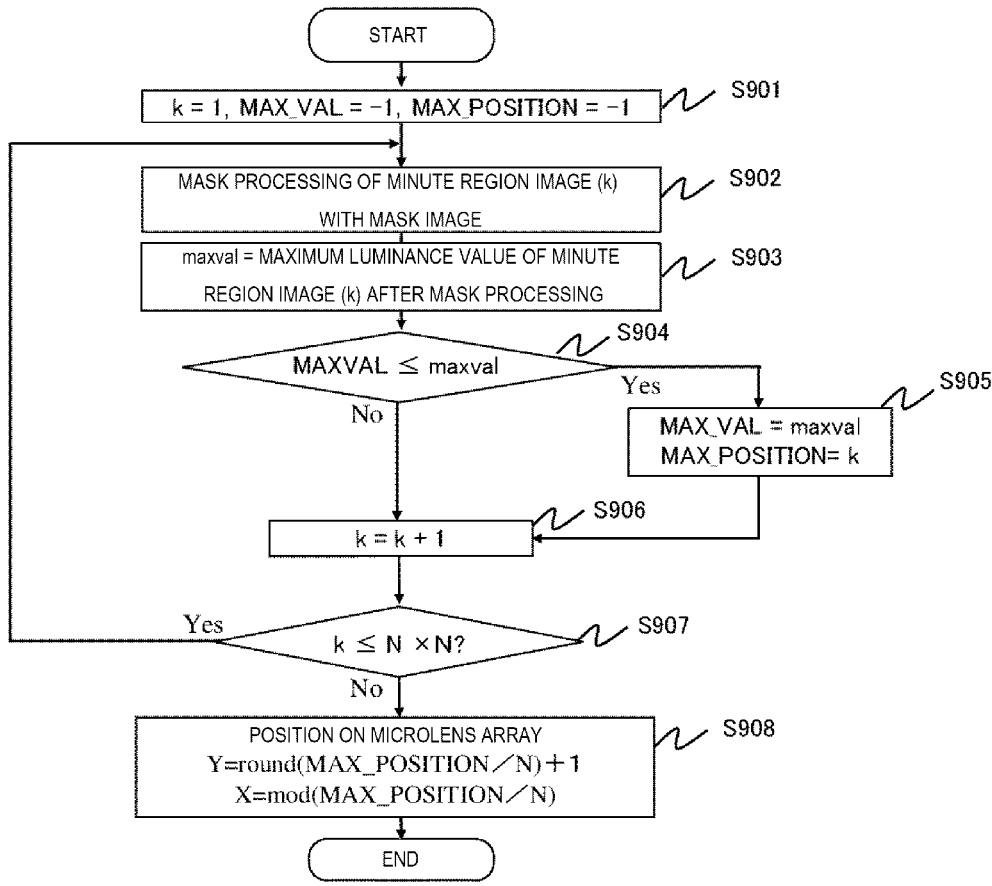
[FIG. 10]
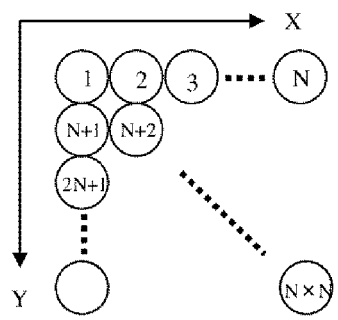

[FIG. 11]
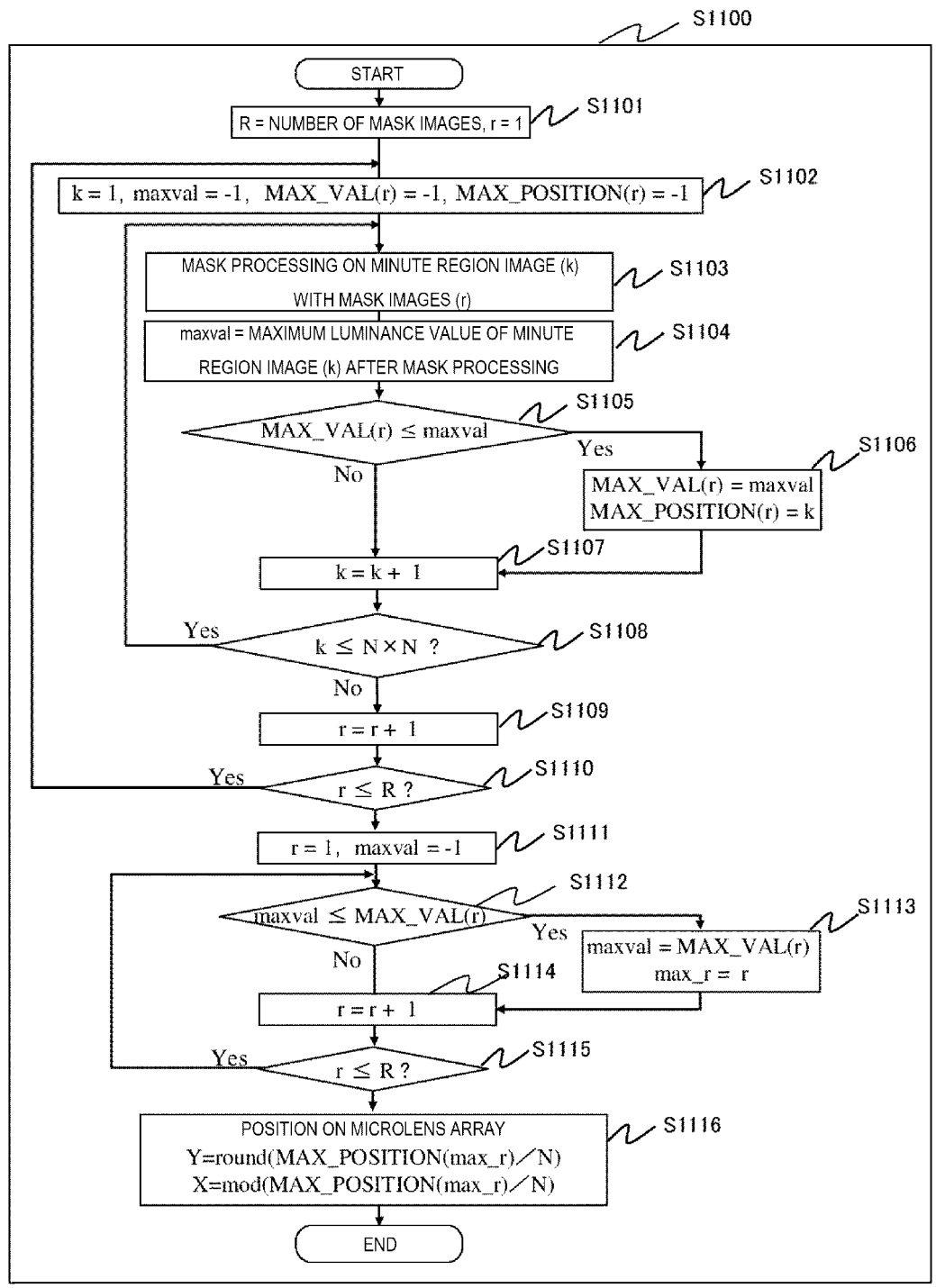

[FIG. 12]
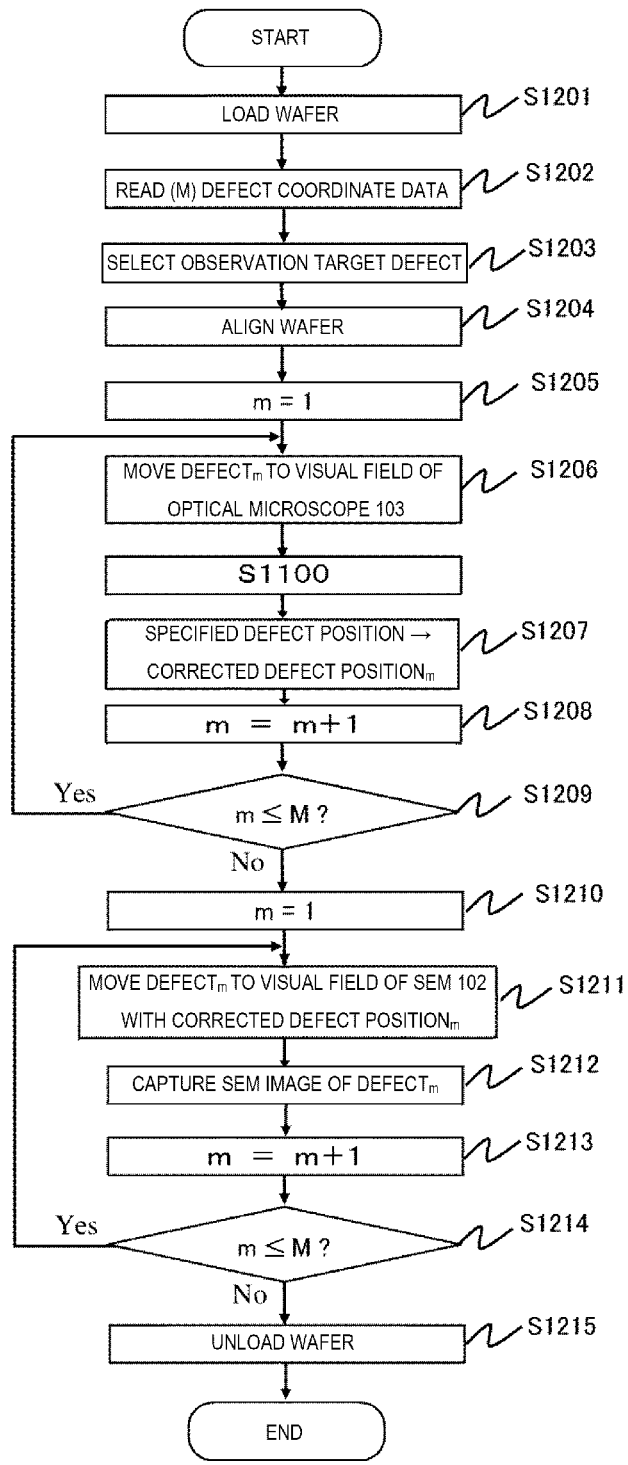

[FIG. 13]
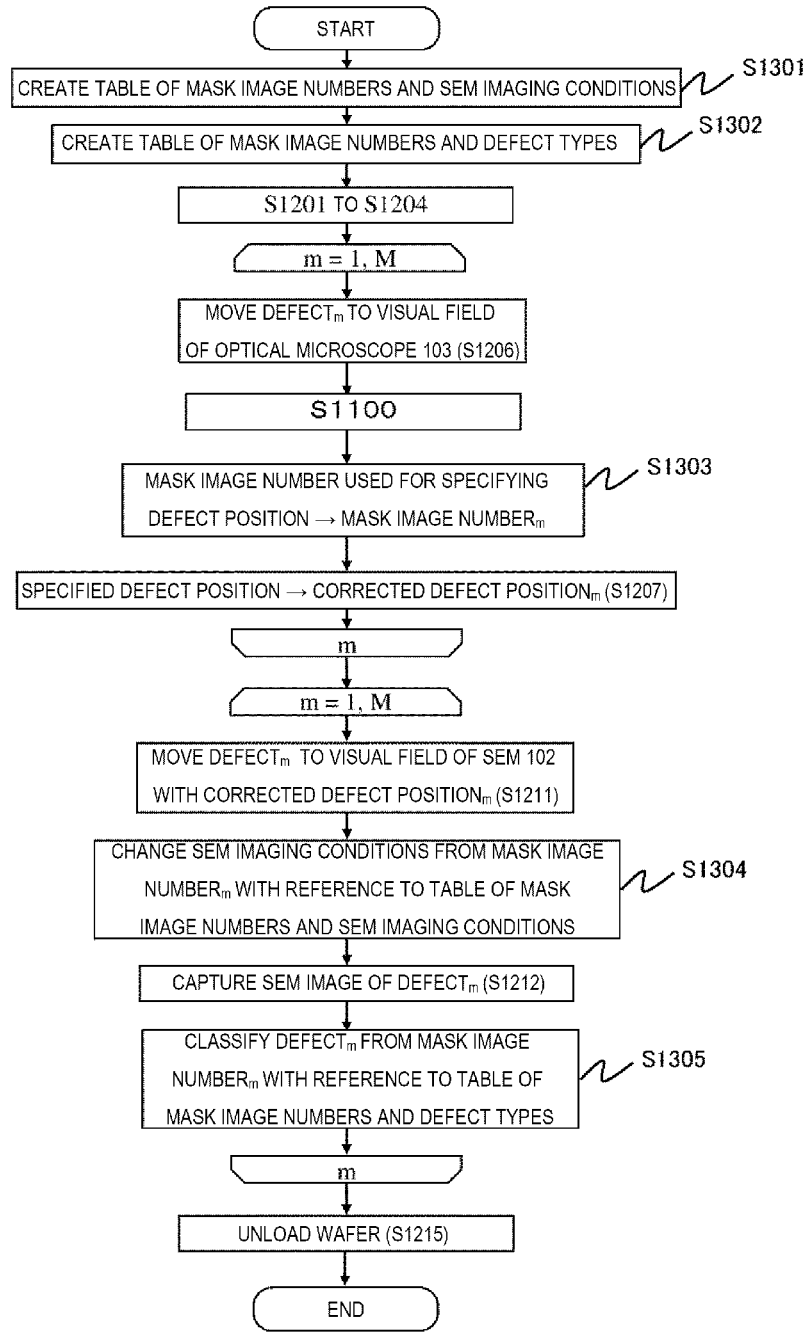

DEFECT DETECTION DEVICE, DEFECT DETECTION METHOD, AND DEFECT OBSERVATION DEVICE

TECHNICAL FIELD

The present invention relates to a defect detection device, a defect detection method, and a defect observation device including the same that inspect a defect or the like on a surface of an object to be inspected such as a bare wafer without a semiconductor pattern, a filmed wafer without a semiconductor pattern.

BACKGROUND ART

In a semiconductor manufacturing process, defect inspections such as a foreign matter defect and a pattern defect on a semiconductor wafer are carried out by a defect position detection by an appearance inspection device and a defect observation by a defect observation device, steps to be taken are narrowed down based on an observation result of defects. Since a semiconductor pattern is becoming finer and minute defects also affect a yield, a scanning electron microscope (SEM) is used in an observation device. Since the appearance inspection device and an SEM-type observation device are different devices and stage coordinates are misaligned, it is difficult to carry out a defect localization in a visual field of the SEM-type observation device using only defect position information detected by the appearance inspection device.

In particular, in an inspection device for an unpatterned wafer, in order to increase an inspection throughput, a spot size of a laser beam is increased to irradiate a semiconductor substrate surface, and a defect position is detected from scattered light thereof, so that defect position coordinates include large error components. When attempting to observe the defects in detail using the SEM based on position information of the defects including such large error components, it is difficult to fit the defects in the visual field of the SEM that is observed at a magnification much higher than that of an optical foreign matter inspection device.

As a method for solving this problem, PTL 1 discloses a method of detecting a defect position with a dark-field optical microscope mounted on an observation device when carrying out a defect observation of an unpatterned wafer with an SEM, and capturing an observation image of the SEM using detected position coordinates. In addition, as a method of detecting a defect on the unpatterned wafer with high sensitivity, a method of detecting the defect position on a wafer by putting a spatial filter in a detection optical path of a dark-field microscope is disclosed. PTL 2 discloses a method using an electrically controllable spatial filter such as a liquid crystal filter or a digital mirror device in order to detect different types of defects with the high sensitivity and high speed.

CITATION LIST

Patent Literature

PTL 1: JP-A-2011-106974
PTL 2: JP-A-2015-59776

SUMMARY OF INVENTION

Technical Problem

In the defect observation of the unpatterned wafer with the SEM, it is desired that a re-detection for the defect localization by an optical microscope can be carried out with the high sensitivity and high throughput for a plurality of types of defects.

PTL 1 discloses a configuration of an electron microscope for the defect observation, which is equipped with a dark-field optical system having the spatial filter on a pupil plane of the detection optical path. However, PTL 1 discloses only a detection of the defects with a specific spatial filter, and does not consider detecting the plurality of types of defects.

PTL 2 discloses a method using the liquid crystal filter or the digital mirror device as a method for quickly switching the spatial filter in response to the plurality of types of defects. However, in the liquid crystal filter, defect detection sensitivity decreases due to a problem of light transmittance, and the liquid crystal filter or the digital mirror device is used by putting the liquid crystal filter or the digital mirror device in an optical path between an objective lens and an imaging lens, so that in particular, an incorporation of the digital mirror device complicates a structure and makes it difficult to downsize an optical system. In addition, since it is necessary to capture a plurality of images while switching the filters, it is not considered to reduce the number of times of capturing and shorten a detection time.

An object of the invention is to provide a defect detection device, a defect detection method, and a defect observation device using the same capable of detecting a plurality of types of defects with high sensitivity and high speed using a compact optical system.

Solution to Problem

An example of the "defect detection device" of the invention for solving the above problems is a defect detection device including an irradiation system configured to irradiate light onto an object to be inspected; an optical system configured to form scattered light produced by a light irradiation into an image; a microlens array disposed at an image plane of the optical system; an imaging element disposed at a position offset from the imaging plane of the optical system and configured to image light that passes through the microlens array; a mask image storage unit storing a plurality of mask images generated for each type of defect or each defect direction; and a calculation unit configured to carry out mask processing on an image obtained from the imaging element using the plurality of mask images and carry out defect detection processing.

In addition, an example of the "defect detection method" of the invention is a defect detection method using an irradiation system configured to irradiate light onto an object to be inspected, an optical system configured to form scattered light produced by a light irradiation into an image, a microlens array disposed at an image plane of the optical system, and an imaging element disposed at a position offset from the imaging plane of the optical system and configured to image light that passes through the microlens array, and the defect detection method includes: a step of storing a plurality of mask images generated for each type of defect or each defect direction; a step of carrying out mask processing on an image obtained from the imaging element using the plurality of mask images; and a step of carrying out defect detection by the image subjected to the mask processing.

In addition, an example of the "defect observation device" of the invention is a defect observation device including an SEM, an optical microscope, and an image processing unit, the optical microscope includes an irradiation system configured to irradiate light onto a sample, an optical system configured to form scattered light produced by a light irradiation into an image, a microlens array disposed at an image plane of the optical system, and an imaging element disposed at a position offset from the imaging plane of the optical system and configured to image light that passes through the microlens array, and the image processing unit includes a mask image storage unit storing a plurality of mask images generated for each type of defect or each defect direction, an image storage unit storing a captured image captured by the imaging element, and a calculation unit configured to calculate a defect position of the sample using the mask images and the captured image.

Advantageous Effect

According to the invention, the plurality of types of defects can be detected with high sensitivity and high speed. In addition, unlike a related art, it is not necessary to form a pupil plane between an objective lens and an imaging lens and dispose a spatial filter, so that the optical system can be downsized.

By mounting the defect detection device on an SEM observation device, it is possible to reliably put various types of defects detected by an optical inspection device in an observation field of an SEM, improve a success rate of automatic imaging of SEM observation images, and improve a throughput of automatic defect imaging by the SEM.

BRIEF DESCRIPTION OF DRAWINGS

FIG. 1 is a configuration diagram showing an example of a defect observation device according to a first embodiment.

FIG. 2 is an internal configuration diagram of an image processing circuit according to the first embodiment.

FIG. 3 is an explanatory diagram of a detection method by an optical system according to the first embodiment.

FIG. 4 is a partially enlarged view of the optical system of FIG. 3.

FIG. 5 is a light intensity distribution diagram of wafer scattered light on a pupil plane.

FIG. 6 is a light intensity distribution diagram on the pupil plane of scattered light due to a minute foreign matter defect.

FIG. 7 is a diagram showing a spatial filter in a related art for detecting the minute foreign matter defect.

FIG. 8 is a diagram showing an example of mask images for detecting the minute foreign matter defect.

FIG. 9 is a flowchart of processing of detecting a defect position in an optical microscope visual field with one mask image.

FIG. 10 is an exemplary diagram of lens numbers and coordinates in a microlens array.

FIG. 11 is a flowchart of processing of detecting the defect position in the optical microscope visual field by using a plurality of mask images.

FIG. 12 is an overall flowchart of SEM imaging using a result of defect position correction by an optical microscope.

FIG. 13 is an overall flowchart of a defect observation device according to a second embodiment of the invention.

DESCRIPTION OF EMBODIMENTS

Hereinafter, embodiments of the invention will be described in detail with reference to the drawings.

First Embodiment

FIG. 1 shows an example of a defect observation device according to the embodiment of the invention. The defect observation device of the embodiment is applied to a device that observes a defect on a wafer generated in a manufacturing process of a semiconductor device.

Reference numeral 101 denotes a wafer that is an object to be inspected. Reference numeral 102 denotes an electron microscope (hereinafter referred to as SEM) that observes the wafer 101 in detail. Reference numeral 103 denotes an optical microscope that optically detects the defect on the wafer 101 and acquires defect position information thereof. Reference numeral 104 denotes a stage on which the wafer 101 can be placed, which makes it possible to move any place on the wafer 101 within visual fields of the SEM 102 and the optical microscope 103. Reference numeral 105 denotes a vacuum chamber, and the SEM 102, the stage 104, and an objective lens 113 of the optical microscope 103 are housed in the vacuum chamber 105.

An inside of the optical microscope 103 will be described. Reference numeral 110 denotes an illumination light source. Laser light emitted from the illumination light source 110 passes through a vacuum-sealed window 111, is reflected by a mirror 112 that controls an illumination position, and is irradiated onto any position on a surface of the wafer 101. Reference numeral 113 denotes the objective lens for collecting scattered light reflected from the sample 101. Light that has passed through the objective lens 113 passes through a vacuum-sealed window 114, forms an image on a microlens array 117 by an imaging lens 115, and is then converted into an electric signal by an imaging element 116. The microlens array 117 is a lens unit in which microlenses are arranged in a grid pattern. Although FIG. 1 shows a configuration in which the objective lens 113 is arranged inside the vacuum chamber 105 and the imaging lens 115 is arranged outside the vacuum chamber 105, as long as the scattered light from the sample 101 can form the image on the microlens array 117, and a vacuum of the vacuum chamber 105 is not broke, the lens may be an integral type lens, may extend inside or outside the vacuum chamber 105, or may extend over both inside and outside thereof.

A control unit 106 includes a stage control circuit 118, an SEM imaging system control circuit 119, an image processing circuit 120, an external input and output I/F 121, a CPU 122, and a memory 123, which are connected to a bus 124, and can mutually input and output information. The stage control circuit 118 controls the stage 104, and the SEM imaging system control circuit 119 controls the SEM 102 and stores a detected image signal in the memory 123. The image processing circuit 120 arithmetically processes image data obtained from the imaging element 116 of the optical microscope 103, and detects a defect position in a captured image. The external input and output I/F 121 outputs display information to a terminal 107, inputs information from the terminal 107, inputs and outputs the information from and to a storage device 108, and inputs and outputs the information from and to a defect inspection device or a higher-level management system (not shown) via a network 109. The image data stored in the memory 123 is arithmetically processed by the CPU 122.

In the defect observation device configured as described above, in particular, the optical microscope 103 has a function of re-detecting (hereinafter, referred to as detecting) the defect position on the wafer 101 by using position information of the defect detected by the defect inspection device (not shown), the control unit 106 has a function as a position correction unit that corrects the position information of the defect based on the position information of the defect detected by the optical microscope 103, and the SEM 102 has a function of observing the defect based on the defect position information corrected by the control unit 106. The stage 104 is configured to be movable such that the defect detected by the optical microscope 103 can be observed by the SEM 102.

FIG. 2 shows details of the image processing circuit 120. The image processing circuit 120 includes a data I/F 201, a mask image data storage unit 202, an image information storage unit 203, a calculation unit 204, and a defect classification unit 206, which are connected to an internal bus 205. An image obtained by the optical microscope 103 is stored in the image information storage unit 203. A mask image is registered previously in the mask image data storage unit 202. The calculation unit 204 carries out calculation processing using the image data stored in the image information storage unit 203 and the mask image stored in the mask image data storage unit 202, and specifies the defect position in the image detected by the optical microscope 103. The defect classification unit 206 classifies defect types based on the selected mask image, as described later with reference to FIG. 13. The data I/F 201 is connected to the internal bus 205 and the bus 124 in the control unit 106, and exchanges data between the image processing circuit 120 and other processing units in the control unit 106.

An action of the microlens array in this optical system will be described with reference to FIGS. 3 and 4. FIG. 4 is an enlarged view of a portion indicated by 303 in FIG. 3. FIG. 3 is a diagram showing optical paths of light rays emitted from points 300 and 301 on the wafer 101 to the imaging element 116. In FIG. 3, the optical system is divided into the objective lens 113 and the imaging lens 115, and a spatial filter 302 is shown in a pupil region formed between the objective lens 113 and the imaging lens 115, but the spatial filter 302 shown here is a virtual one, and is drawn to explain that the action of the microlens array of this configuration has an effect the same as that of the spatial filter in a related art. The light ray emitted from the point 300 is divided into a light ray (corresponding to 400 in FIG. 4) passing through an opening part of the spatial filter shown by a thick solid line and a light ray shielded by the spatial filter 302 shown by a thin solid line. In FIG. 3, for explanation, the optical path is shown by the thin solid line even after being shielded by the spatial filter 302 (corresponding to 401 in FIG. 4).

Microlenses 410 and 411 in FIG. 4 are lenses that form the microlens array 117, and are placed on an image plane of the wafer. From the figure, the microlens 410 corresponds to a position of the point 300 on the wafer 101 (400 and 401 are optical paths of the light emitted from the point 300 on the wafer 101), and pixels 404, 405, and 406 of the imaging element to which the light passing through the microlens 410 is incident correspond to positions where the respective light rays pass through the imaging lens 115. In a pupil space formed between the objective lens 113 and the imaging lens 115, since the light rays are parallel, the pixels 404, 405, and 406 correspond to spatial positions of a pupil plane. That is, in an example of the spatial filter 302 in FIG. 3, opening parts of the spatial filter correspond to the pixels 404 and 405, and a shield portion corresponds to the pixel 406. From the above, even when the spatial filter 302 is not provided, after the imaging element 116 receives light, an effect equivalent to that of the spatial filter 302 can be obtained in a minute region corresponding to the microlens 410 by carrying out processing of invalidating the pixel on which the light ray shielded by the spatial filter 302 is incident, in the related art. In FIG. 4, the valid pixels 404 and 405 are shown as white squares, and the invalid pixel 406 is shown as a black square.

Although FIGS. 3 and 4 show the microlens array 117 and the imaging element 116 one-dimensionally, actually, the microlens array 117 has a microlens having a planar spread in the grid pattern, and the imaging element 116 is an area sensor. A portion shown by one row and three pixels corresponding to the microlens 410 in FIG. 4 may be configured by the number of plane pixels that can practically express a spatial filter shape for each defect type. Similarly, the point 301 on the wafer 101 corresponds to the microlens 411 and pixels 407, 408, and 409 of the imaging element. In this way, for example, using a microlens array formed of N×N microlenses, an entire visual field on the wafer can be detected with a resolution of N×N, and in order to express the spatial filter with a resolution of M×M, an area sensor with the number of effective pixels of N×N×M×M can be used for imaging. Hereinafter, it is assumed that the microlens array is formed of N×N, and the visual field of one microlens is imaged with M×M pixels.

FIG. 21(*a*) of PTL 1 discloses an intensity distribution of a radial polarization (P polarization) component and an azimuth polarization (S polarization) component of the scattered light from a wafer surface, which is calculated using a scattered light simulation. FIG. 5 is a total of intensities of the radial polarization component and the azimuth polarization component and is a simulated diagram of a light intensity distribution observed by the scattered light from the wafer. The stronger a scattered light intensity, the whiter the simulated diagram is drawn.

Similarly, FIG. 21(*b*) of PTL 1 discloses an intensity distribution of the radial polarization (P polarization) component and the azimuth polarization (S polarization) component of the scattered light from a spherical foreign matter having a diameter of 18 nm. FIG. 6 is a total of the intensities of the radial polarization component and the azimuth polarization component and is a simulated diagram of the light intensity distribution observed by the scattered light of the spherical foreign matter having the diameter of 18 nm. Similarly to FIG. 5, the stronger the scattered light intensity, the whiter the simulated diagram is drawn.

FIG. 7 shows one of light-shielding plates of a spatial filter disclosed in FIG. 34 of PTL 1, and discriminates the scattered light from the wafer shown in FIG. 5 and the scattered light from the spherical foreign matter shown in FIG. 6. A black portion is a shielding part and a white portion is an opening part. Comparing the shielding part and the opening part in FIG. 7 with the light intensity distributions in FIGS. 5 and 6, most of the scattered light from the wafer in FIG. 5 is shielded by the spatial filter, and a right half of the scattered light from the spherical foreign matter in FIG. 6 passes through the opening part. As a result, most of the scattered light after passing through the spatial filter is from the spherical foreign matter, and the scattered light of a foreign matter can be extracted with high sensitivity from the scattered light from the foreign matter on the wafer.

Although the intensity distributions in FIGS. 5 and 6 are observed in a cross section of a space between the objective lens 113 and the imaging lens 115 in FIG. 3, as long as there is the spherical foreign matter having the diameter of 18 nm at the point 300 in FIG. 3, even on the imaging element corresponding to the microlens 410 shown in FIG. 4, the light intensity distributions in FIGS. 5 and 6 occur, and as a result, a light intensity distribution image corresponding to a target minute region can be obtained.

FIG. 8 is an image of the spatial filter of FIG. 7 with the resolution of M×M. The image is the mask image and is stored in the mask image data storage unit 202 of FIG. 2. Pixel values shown in FIG. 8 are 0 for black and 1 for white.

Since the image observed in a spatial cross section between the objective lens 113 and the imaging lens 115 is vertically and horizontally inverted on the imaging element, the image is actually vertically and horizontally inverted in FIG. 8.

Hereinafter, processing of detecting the defect position in an optical microscope visual field with one mask image will be described with reference to a flowchart of FIG. 9. Mask processing is carried out on the light intensity distribution image of the target minute region obtained through the microlens 410 shown in FIG. 4. That is, pixels corresponding to the black pixel in FIG. 8 of minute region light intensity distribution images (hereinafter, referred to as minute region images) are set to 0, and pixels corresponding to the white pixel in FIG. 8 of the minute region images retain original pixel values (S902). Thus, it is possible to obtain an effect the same as light shielding by the spatial filter in the related art. The same processing is carried out on the micro region images corresponding to all N×N microlenses, and from the processed N×N minute region images, a minute region image having the maximum luminance or an average maximum luminance including neighboring pixels is selected (S905). Since a detection visual field of the optical system is determined by the N×N microlens array, the defect position in the detection visual field can be specified by a position of the microlens corresponding to the minute region image having the maximum luminance (S908). However, round ( ) in S908 represents an integer part of a result of division, and mod ( ) represents a remainder number.

In addition, FIG. 10 shows an example of a method of assigning numbers of the microlenses and X and Y coordinates of the microlens array. For example, in FIG. 9, when MAX_POSITION is N+2, Y=2 and X=2. In order to convert a position in the visual field into actual coordinate values, it is sufficient to multiply obtained X and Y by a pixel pitch and an imaging magnification. In addition, if a relative positional relationship between a center of the visual field of the optical microscope 103 and an origin of the stage 104 is determined by calibration, a defect coordinate position in an optical system visual field can be converted into coordinates of the stage 104, and from the defect position detected by the optical microscope 103, the defects can be located at a center of the visual field of the SEM 102.

The intensity distribution of the scattered light changes depending not only on the defect types but also on defect directions. Therefore, as long as a plurality of mask images are prepared corresponding to the defect directions, a defect position detection can be dealt with. According to the method of the invention, the defect position detection can be achieved by previously preparing the mask images for the plurality of types of defects or the plurality of defect directions and carrying out the mask processing on the detected minute region light intensity distribution images.

With reference to a flowchart of FIG. 11, a content of processing of detecting the defect position in the optical microscope visual field using the plurality of mask images will be described. The number of the types of the defect to be detected is set to R, and corresponding mask images are prepared (S1101). Each mask image is referred to as a mask image (r). Processing from 51102 to 51108 is the processing for the mask image (r), and is the same as the content described in FIG. 9. Maximum luminance values MAX_VAL (r) and MAX_POSITION (r) are recorded (S1106) and the processing is repeated until all masks are processed (S1110). When all the mask processing is completed, an image number (max_r) having the maximum luminance is detected in steps S1111 to S1115 (S1113). The defect position in the detection visual field is specified from the max_r (S1116). A method of specifying the defect position is similar to that described in FIG. 9.

Although the maximum luminance value MAX_VAL (r) is recorded in the above description, the maximum luminance value to be recorded may obtain the MAX_VAL (r) by normalizing an area of one of the mask images (a portion corresponding to the opening part of the spatial filter), multiplying a coefficient predetermined for each defect type, or the maximum luminance value obtained after normalizing a luminance value of the image after subjected to the mask processing.

By a mask image number max_r for detecting the defect position, a property of the defect corresponding to the mask image number max_r, for example, a property of unevenness, can be manifested in observation images of the SEM, in generating SEM observation images, for example, when generating the observation images using a secondary electron image and a backscattered electron image detected by the SEM, it is possible to change image capturing conditions such as a mixing ratio of each image for each defect.

FIG. 12 illustrates a procedure of correcting defect coordinates by the optical system and collecting SEM defect images by the SEM shown in FIG. 1 with reference to FIGS. 1 and 2. First, the wafer 101 that is an observation target is loaded on the stage 104 (S1201). Next, defect coordinate data of the defect detected previously by the inspection device is read into the memory 123 via the external input and output I/F 121 of the overall control unit 106 (S1202), and the defect at M points as the observation target is selected from the defect coordinate data (S1203). A defect selection may be executed by the CPU 122 according to a preset program, or the defect may be selected by an operator via the terminal 107. Next, a wafer alignment is carried out (S1204). The wafer alignment is to associate wafer coordinates with stage coordinates using a positioning mark (an alignment mark) in which coordinates on the wafer are known, since when the stage 104 is moved based on a position of the defect coordinates described by the coordinates on the wafer, the position of the defect coordinates that is a target is near a center of the visual field of the SEM 102 and the visual field of the optical microscope 103. A result of the association is stored in the memory 123 as alignment information.

Next, defect positions of defects 1 to M selected as the observation target are corrected. First, a defect m is moved to the visual field of the optical microscope 103 (S1206). This movement is carried out by calculating the stage coordinates corresponding to the defect m by the CPU 122 from the defect coordinate data stored in the memory 123 and the alignment information and accordingly driving the stage 104 via the stage control circuit 118. After the stage is moved, the position of the defect$_m$ is specified by processing shown in FIG. 11 (S1100), and the position of the specified defect is stored as a corrected defect position$_m$ (S1207). When executing S1100, an image of the defect m captured by the optical microscope 103 is stored in the image information storage unit 203, the image of the defect m and the mask image stored in the mask image data storage unit 202 are read by the calculation unit 204, and the calculation unit 204 carries out the mask processing and the processing shown in S1100 of FIG. 11. The above processing of S1206, S1100, and S1207 is carried out on the defect m (m=1, . . . , M). As for the inspection device, there is also a device that outputs not only the detected defect position coordinates but also information on characteristics of the defect. For example, if it is previously known whether the defect is convex or concave based on defect characteristic information, the mask images to be used may be changed and used for each defect.

In order to realize this, information for specifying used mask images corresponding to the defect characteristic information is previously stored in the memory 123 as a table. Then, when the defect coordinate data of the defect detected by the above inspection device is read into the memory 123, the defect characteristic information is also read. When reading defect information for each defect by the CPU 122, mask image specifying information to be used may be read with reference to table information stored in the memory 123 and the mask images used when executing the processing S1100 may be read from the mask image data storage unit 202.

After corrected defect positions m of all the defects m (m=1, . . . , M) are obtained, the corrected defect positions m are read from the memory 123, after the position information is converted into the stage coordinates as necessary, the defects m are sequentially moved to the visual field of the SEM 102 by giving the stage coordinates to the stage control circuit 118 (S1211), and SEM images of the defects m then are captured (S1212, S1213, S1214). After capturing the SEM images of all the defects, the wafer is unloaded (S1215), and the processing ends.

The mask images depend on types or directions of the defects. From the mask images used for detecting the defect position, the types or directions of the defects can be known before SEM imaging. Thus, it is possible to set an optimum imaging condition in which the defect is easy to see, depending on the types or directions of the defects. In addition, since the types or directions of the defects can be known from the mask images used for detecting the defect position, the types or directions of the defects can also be used as classification information of the defects.

Second Embodiment

FIG. 13 shows an example of an overall flowchart of a defect observation device according to a second embodiment of the invention. In the second embodiment, information of the mask images used for defect detection is used to control SEM imaging conditions and classify defect images captured by the SEM. The configuration of the defect observation device is as shown in FIGS. 1 and 2, and in particular, the image processing circuit 120 of FIG. 2 includes the defect classification unit 206.

For steps the same as processing steps in FIG. 12, step numbers shown in FIG. 12 are described in squares of the steps. Also, a notation of a loop is changed to make a flow diagram easier to see. First, a table of a correspondence between mask image numbers and the SEM imaging conditions is created using the terminal 107 or an external input device (S1301) and stored in the memory 123. Similarly, a table of the mask image numbers and the defect types is created (S1302) and stored in the memory 123. S1301 and S1302 do not necessarily have to be carried out for each wafer, but may be carried out for each product of the semiconductor device to be observed or each manufacturing process, as long as the table is created for each condition in which the mask image numbers and the SEM imaging conditions or the mask image numbers and the defect types have a fixed relationship.

After wafer loading, defect coordinate data reading, observation target defect selection, and wafer alignment are carried out in S1201 to S1204 shown in FIG. 13, the defect position is detected by the optical microscope and the coordinates are corrected in S1206, S1100, and S1207. At this time, the mask image number used for specifying the defect position in S1303 is stored in the memory 123 as a mask image number$_m$.

After coordinate correction of the defect position is completed, the defect images are captured by the SEM in S1211 and S1212. When imaging each defect, with reference to the table of the mask image numbers and the SEM imaging conditions stored in the memory 123 and the mask image number$_m$ corresponding to imaging defects, the SEM imaging conditions are changed via the SEM imaging control circuit 119 (S1304). A change of the SEM imaging conditions may be a change of an image mixing ratio when generating the observation image from the plurality of captured images. In addition, with reference to the table of the mask image numbers and the defect types stored in the memory 123 and the mask image number$_m$ corresponding to the imaging defects, classification information of the defect$_m$ is stored in the memory 123, and is used as defect classification information (S1305). S1305 may be executed after S1100 of a defect position detection processing by the optical microscope.

By mounting an optical detection system described above in an SEM defect observation device, it is possible to detect the defect position with the high sensitivity and high speed for a plurality of types of defects detected by the inspection device. In the related art, although an optically different detection is carried out by changing the spatial filter, in the invention, the detection is realized by the image processing, so that optical imaging needs to be carried out once per defect, and there is no reduction in throughput due to imaging time. By carrying out SEM observation at a defect detection position by optical detection, the defects can be reliably placed in an observation field of the SEM, a success rate of automatic imaging of the SEM observation images of the defects detected by the inspection device is improved, and the throughput of an automatic defect imaging by the SEM is also improved. In addition, according to the optical system of the invention, the pupil space between lenses, which is required to install the spatial filter in the related art, is not required, so that downsizing of the optical microscope can also be realized.

REFERENCE SIGNS LIST

101 wafer
102 SEM
103 optical microscope
104 stage
105 vacuum chamber
106 control unit
107 terminal
108 storage device
109 network
110 illumination light source
111 vacuum-sealed window
112 mirror
113 objective lens
114 vacuum-sealed window
115 imaging lens
116 imaging element
117 microlens array
118 stage control circuit
119 SEM imaging system control circuit
120 image processing circuit
121 external input and output I/F
122 CPU 123 memory
124 bus
201 data I/F
202 mask image data storage unit
203 image information storage unit
204 calculation unit
205 internal bus
206 defect classification unit

The invention claimed is:

1. A defect detection device comprising:
an irradiation system configured to irradiate light onto an object to be inspected;
an optical system configured to form scattered light produced by a light irradiation into an image;
a microlens array disposed at an image plane of the optical system;
an imaging element disposed at a position offset from the imaging plane of the optical system and configured to image light that passes through the microlens array;
a mask image storage unit storing a plurality of mask images generated for each type of defect or each defect direction; and
a calculation unit configured to carry out mask processing on an image obtained from the imaging element using the plurality of mask images and carry out defect detection processing.

2. The defect detection device according to claim 1, wherein
the mask image distinguishes scattered light from a semiconductor wafer from scattered light from the defect.

3. The defect detection device according to claim 1, wherein
the calculation unit detects a defect position from a high-luminance image among images obtained by carrying out the mask processing using the plurality of mask images.

4. The defect detection device according to claim 1, further comprising:
a defect classification unit configured to classify defect types based on the mask image selected in the defect detection processing.

5. A defect detection method using an irradiation system configured to irradiate light onto an object to be inspected, an optical system configured to form scattered light produced by a light irradiation into an image, a microlens array disposed at an image plane of the optical system, and an imaging element disposed at a position offset from the imaging plane of the optical system and configured to image light that passes through the microlens array, the defect detection method comprising:
a step of storing a plurality of mask images generated for each type of defect or each defect direction;
a step of carrying out mask processing on an image obtained from the imaging element using the plurality of mask images; and
a step of carrying out defect detection by the image subjected to the mask processing.

6. The defect detection method according to claim 5, wherein
the mask image distinguishes scattered light from a semiconductor wafer from scattered light from the defect.

7. The defect detection method according to claim 5, wherein
the step of carrying out the defect detection detects a defect position from a high-luminance image among images obtained by carrying out the mask processing using the plurality of mask images.

8. The defect detection method according to claim 5, further comprising:
a step of classifying defect types based on the mask image selected in the defect detection processing.

9. A defect observation device comprising:
an SEM;
an optical microscope; and
an image processing unit, wherein
the optical microscope includes an irradiation system configured to irradiate light onto a sample, an optical system configured to form scattered light produced by a light irradiation into an image, a microlens array disposed at an image plane of the optical system, and an imaging element disposed at a position offset from the imaging plane of the optical system and configured to image light that passes through the microlens array, and
the image processing unit includes a mask image storage unit storing a plurality of mask images generated for each type of defect or each defect direction, an image storage unit storing a captured image captured by the imaging element, and a calculation unit configured to calculate a defect position of the sample using the mask images and the captured image.

10. The defect observation device according to claim 9, wherein
the mask image distinguishes scattered light from a semiconductor wafer from scattered light from the defect.

11. The defect observation device according to claim 9, wherein
the calculation unit calculates the defect position from a high-luminance image among images obtained by carrying out the mask processing using the plurality of mask images.

12. The defect observation device according to claim 9, wherein
an observation image is generated by changing a mixing ratio of images having different properties such as a secondary electron image and a backscattered electron image obtained by the SEM, by the mask image used for calculating the defect position.

13. The defect observation device according to claim 9, further comprising:
a defect classification unit configured to classify defect types based on the mask image selected in the defect detection processing.

* * * * *